US010631438B2

United States Patent
Coteus et al.

(10) Patent No.: US 10,631,438 B2
(45) Date of Patent: Apr. 21, 2020

(54) MECHANICALLY FLEXIBLE COLD PLATES FOR LOW POWER COMPONENTS

(71) Applicant: International Business Machines Corporation, Armonk, NY (US)

(72) Inventors: Paul W. Coteus, Yorktown, NY (US); Mark D. Schultz, Ossining, NY (US); Todd E. Takken, Brewster, NY (US); Shurong Tian, Mount Kisco, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/853,791

(22) Filed: Dec. 23, 2017

(65) Prior Publication Data

US 2019/0200485 A1 Jun. 27, 2019

(51) Int. Cl.
*H05K 7/20* (2006.01)
*H01L 23/367* (2006.01)
(Continued)

(52) U.S. Cl.
CPC ........... *H05K 7/20509* (2013.01); *G06F 1/20* (2013.01); *H01L 23/367* (2013.01);
(Continued)

(58) Field of Classification Search
CPC ..... H01L 23/367; H01L 23/3736; G06F 1/20; G06F 1/203; H05K 7/20509;
(Continued)

(56) References Cited

U.S. PATENT DOCUMENTS 4,246,597 A * 1/1981 Cole .................. H01L 23/3675
165/185
4,322,776 A * 3/1982 Job ...................... H05K 7/1418
165/185

(Continued)

OTHER PUBLICATIONS

J. Strydom et al., "Gallium Nitride Transistor Packaging Advances and Thermal Modeling", Efficient Power Conversion Corp., Sep. 2012, downloaded from the Internet Sep. 18, 2017, http://epc-co.com/epc/Portals/0/epc/documents/product-training/Gallium%20Nitride%20Transistor%20Packaging%20Advances.pdf, pp. 1-13.

*Primary Examiner* — Adam B Dravininkas
(74) *Attorney, Agent, or Firm* — Daniel P. Morris; Otterstedt, Wallace & Kammer, LLP

(57) ABSTRACT

An assembled circuit board has a topology that defines positions, dimensions and power dissipation of components mounted to the circuit board, including a high power component and one or more low power components. A cold plate makes thermal contact to the high power component through a thermal interface material. A thermally conductive sheet overlays the circuit board and is formed to match the topology of the low power component or components. The sheet has a first portion that makes thermal contact with the cold plate and a second portion that overlays the low power component or components. The cold plate removes heat directly from the high power component and indirectly through the thermally conductive sheet from the low power component or components. The thermally conductive sheet conforms to the topology of the low power components either by preforming or by flexibility.

15 Claims, 4 Drawing Sheets

(51) Int. Cl.
 *H01L 23/473* (2006.01)
 *G06F 1/20* (2006.01)
 *H01L 23/373* (2006.01)
 *H01L 23/40* (2006.01)

(52) U.S. Cl.
 CPC ....... *H01L 23/473* (2013.01); *H05K 7/20254* (2013.01); *H05K 7/20518* (2013.01); *H01L 23/3736* (2013.01); *H01L 23/3737* (2013.01); *H01L 23/40* (2013.01)

(58) Field of Classification Search
 CPC ........... H05K 7/20809; H05K 7/20336; H05K 7/20772; H05K 1/141; H05K 7/20927; H05K 7/20254; H05K 1/0203; H05K 1/0272; H05K 3/0061; H05K 1/144; H05K 7/20936
 See application file for complete search history.

(56) References Cited

U.S. PATENT DOCUMENTS

| | | | | |
|---|---|---|---|---|
| 4,442,450 | A * | 4/1984 | Lipschutz | H01L 23/433 165/80.2 |
| 5,159,531 | A * | 10/1992 | Horvath | H01L 23/3672 165/185 |
| 5,299,939 | A | 4/1994 | Walker et al. | |
| 5,528,456 | A | 6/1996 | Takahashi | |
| 5,548,090 | A * | 8/1996 | Harris | H01L 23/3675 174/250 |
| 5,904,796 | A | 5/1999 | Freuler et al. | |
| 6,054,198 | A | 4/2000 | Bunyan et al. | |
| 7,063,127 | B2 | 6/2006 | Gelorme et al. | |
| 7,200,006 | B2 | 4/2007 | Farrow et al. | |
| 7,593,228 | B2 | 9/2009 | Jarrett et al. | |
| 7,694,719 | B2 | 4/2010 | Furman et al. | |
| 7,907,410 | B2 | 3/2011 | Martin et al. | |
| 7,995,344 | B2 | 8/2011 | Dando et al. | |
| 2002/0159233 | A1 * | 10/2002 | Patel | G06F 1/20 361/702 |
| 2007/0159799 | A1 * | 7/2007 | Dando, III | H05K 7/20445 361/709 |
| 2007/0177356 | A1 * | 8/2007 | Panek | G06F 1/20 361/712 |
| 2008/0084668 | A1 * | 4/2008 | Campbell | H01L 23/473 361/702 |
| 2012/0287582 | A1 * | 11/2012 | Vinciarelli | H01R 43/24 361/728 |
| 2012/0300405 | A1 * | 11/2012 | Weeber | H01L 23/552 361/709 |
| 2012/0320529 | A1 * | 12/2012 | Loong | H01L 23/3735 361/702 |
| 2013/0058695 | A1 * | 3/2013 | Jensen | H05K 7/20436 400/76 |
| 2013/0214406 | A1 * | 8/2013 | Schultz | H01L 23/46 257/713 |
| 2014/0146479 | A1 * | 5/2014 | Kilroy | H01L 23/367 361/717 |
| 2015/0092352 | A1 * | 4/2015 | Chainer | H01L 23/34 361/720 |
| 2018/0027696 | A1 * | 1/2018 | Franz | G06F 1/20 361/679.47 |

* cited by examiner

MECHANICALLY FLEXIBLE COLD PLATES FOR LOW POWER COMPONENTS

BACKGROUND

The present invention relates to the electrical, electronic, and computer arts, and more specifically, to thermal management for electronic components.

Conventional computer systems are built of components, such as individual integrated circuits, that are assembled to a printed circuit board known as a backplane or motherboard. Each component consumes electrical power, and dissipates some of that power as waste heat. Waste heat increases the temperature of a computer system, and increasing temperature detracts from reliable operation of the computer system. Accordingly, it is desirable to remove waste heat from the computer system using cooling components such as cold plates. However, different components dissipate different quantities of waste heat; low power components dissipate less heat than high power components. While cold plates are an efficient solution for high power components, they may not be optimal for low power components. For example, cold plates may be suboptimal for low power components because cold plates provide more cooling power than is needed, at a higher cost than is desirable. One factor in the high cost of cold plate cooling is that cold plates must be positioned in close proximity to the components they are meant to cool, and positioning and providing fluid connections to a cold plate for each component is expensive. Air cooling is another option for low power components, but this also may be suboptimal. For example, air cooling may be suboptimal because it requires a fan, which dissipates its own waste heat, or because the customer wishes to save money at the facility level by removing all system heat to evaporatively cooled water.

SUMMARY

Principles of the invention provide mechanically flexible cold plates for low power components. In one aspect, a circuit board has a topology that defines positions, dimensions and power dissipation of components mounted to the circuit board, including a high power component mounted to the circuit board and one or more low power components mounted to the circuit board. A cold plate makes thermal contact to the high power component through a first thermal interface material (TIM). A thermally conductive sheet is preformed to match the topology. The sheet has a first portion that makes thermal contact with the cold plate and a second portion that overlays the low power component or components. Thermal contact to the low power components is made through a second TIM or set of TIMs. Thermal contact to the low power component or components can be enhanced by designing the thermally conductive sheet to be flexible, thereby the maximal second TIM thickness require to make thermal contact to the low power component or components.

In another aspect, a method includes obtaining a topology of a circuit board, which defines positions, dimensions and power dissipation of components on the circuit board; the components include a high power component and one or more low power components. The method further includes providing a cold plate which makes thermal contact to the high power component through a first thermal interface material (TIM). The method further includes preforming a thermally conductive sheet to match the topology. The sheet has a first portion that makes thermal contact with the cold plate and a second portion that matches the topology of the low power component or components. The thermally conductive sheet makes thermal contact to the low power components through a second TIM or set or TIMs. This thermal contact can be enhanced by making the sheet flexible, thereby reducing the maximal required second TIM thickness.

In another aspect, a cold plate is provided with a thermally conductive sheet that has a first portion attached to the cold plate and that extends outward from a periphery of the cold plate to a second portion.

In view of the foregoing, techniques of the present invention can provide substantial beneficial technical effects. For example, one or more embodiments provide one or more of:

Cost effective cooling of both high power components and low power components by a single fluid-cooled structure.

Reworkability of a fluid-cooled circuit board assembly by unitary installation and removal of a fluid-cooled structure that cools all the components of the board.

These and other features and advantages of the present invention will become apparent from the following detailed description of illustrative embodiments thereof, which is to be read in connection with the accompanying drawings.

DETAILED DESCRIPTION

Figure 1:
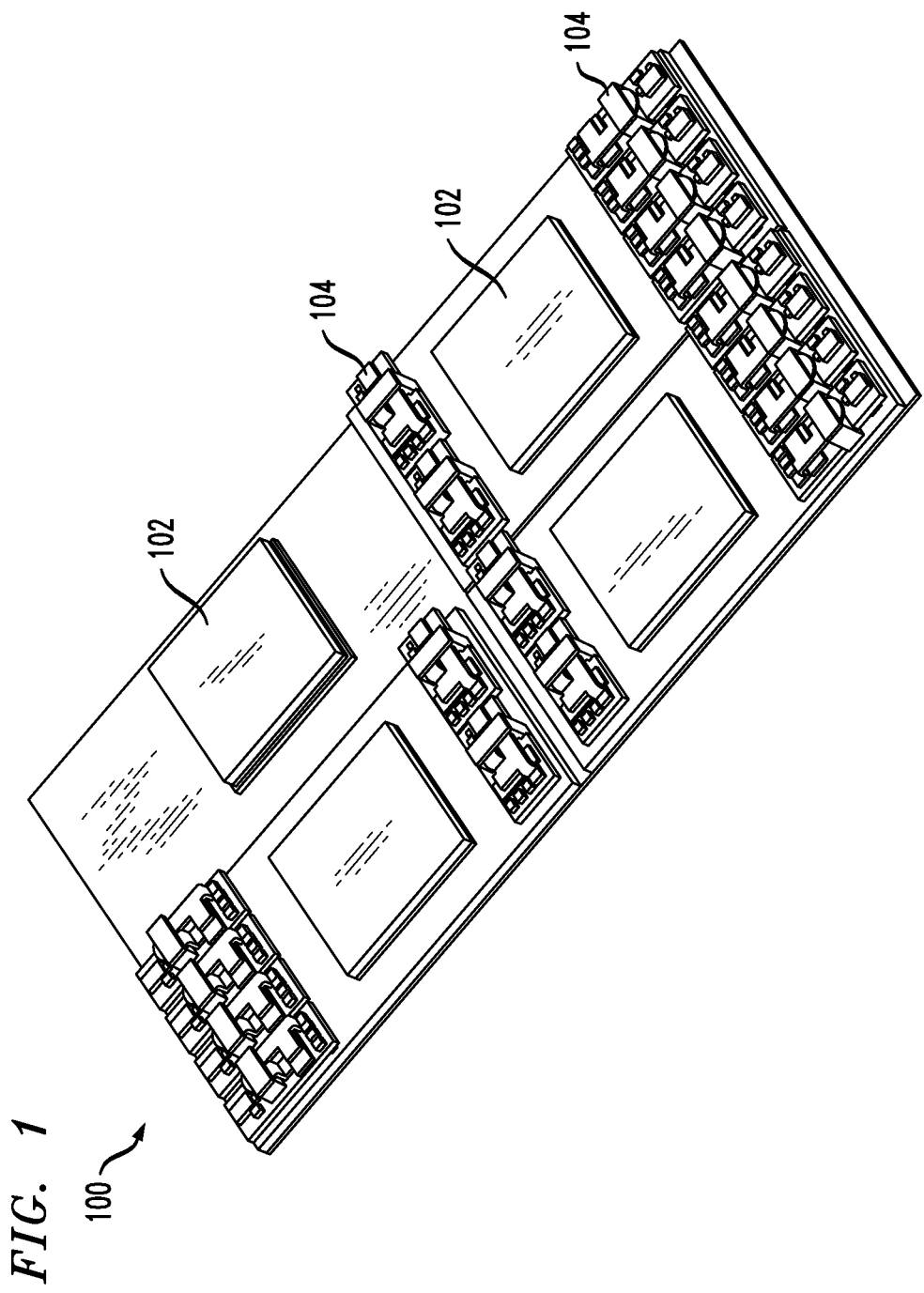
FIG. 1 depicts a circuit board on which a plurality of components are mounted.

FIG. 1 shows a circuit board 100 on which a plurality of components are mounted. The circuit board has a topology that defines dimensions and power dissipation of the components on the circuit board. The components include a high power component 102 and a low power component 104. The high power component 102 typically dissipates in excess of 25 Watts thermal power, while the low power component 104 typically dissipates less than 5 Watts thermal power. Typically, the high power component 102 would be cooled by a cold plate (which is, for example, a hollow plate defining interior channels through which a coolant fluid is forced to remove heat by convection). The low power component 104 typically would be cooled by convection of the ambient air. In some cases the ambient air would be driven by a fan, and in some cases a heat sink would be assembled in thermal contact with the low power component. The high power component 102 protrudes from the circuit board to a first height and the low power component 104 protrudes from the circuit board to a second height that is different from the first height.

Figure 2:
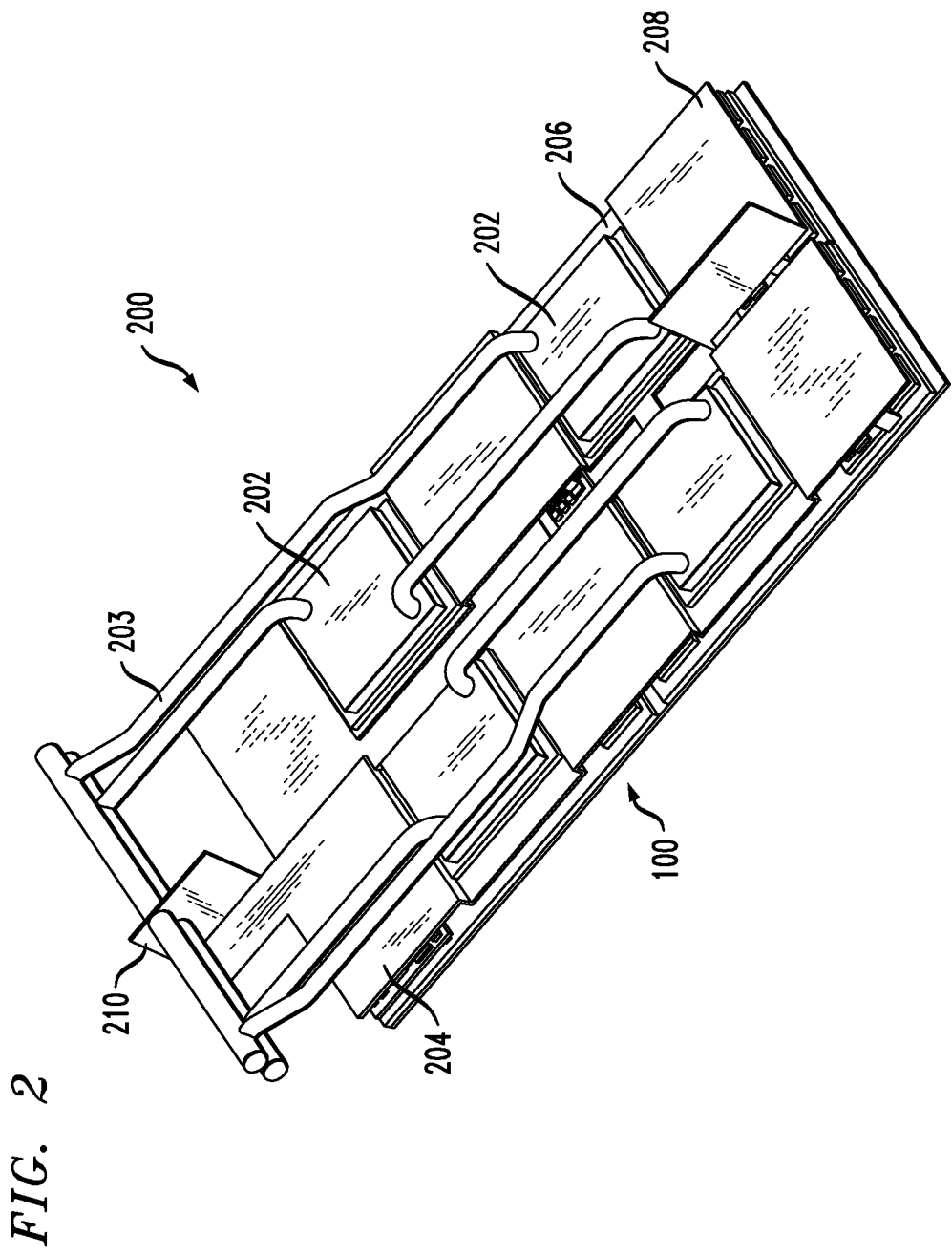
FIG. 2 depicts a cold plate assembly overlaid onto the circuit board of FIG. 1, according to an exemplary embodiment of the invention.

According to an exemplary embodiment of the invention, FIG. 2 shows a cold plate assembly 200 overlaid onto the circuit board 100. The mechanically flexible cold plate assembly 200 includes a cold plate 202, coolant piping 203, and a sheet 204 attached to the cold plate 202. When a common sheet 204 makes thermal contact with more than one cold plate 202, the sheet is designed to be flexible, or the thermal contact between the sheet and the cold plates is flexible or has slippage, in order to allow for mechanical tolerances in the assembled heights of the cold plates 202. The sheet 204 is formed of a thermally conductive flexible material that makes a thermal contact with the cold plate 202, either through a flexible or slippable thermal interface such as metal spring fingers 205, or by being mechanically integrated with the cold plate 202, for example, by welding, brazing, crimping, dovetailing, or thermally conductive adhesive such as silver-loaded epoxy. In this context, "thermally conductive" signifies a specific thermal conductivity not less than 0.5 Watt/meter-Kelvin (W/m-K). "Flexible" signifies a sheet which will move in response to varying loads and component heights so as to maintain contact with the components to be cooled. In some cases the "contact" would be to a thermal interface material disposed between the thermally conductive sheet and a component to be cooled. In all cases the flexibility of the sheet or of the thermal interface material must be sufficient to maintain thermal contact between the sheet and the low power components while not causing damage to the contacted components upon attachment or loading. A typical cold plate formed from annealed copper is about 7.5 millimeters (mm) thick and one to four inches in each lateral dimension. Such a cold plate is relatively inflexible, requiring approximately 25 pounds (lbs) of applied force at one end of a 1 inch by three inch continuous section of such cold plate, in order to cause a 0.5 mm vertical deflection when the other end of the cold plate section three inches away is constrained. By contrast, a thermally conducting sheet according to an exemplary embodiment is formed of 6063 alloy aluminum about 1 mm thick and is much more flexible. A one inch by three inch section of such a sheet requires only about a tenth of a pound of applied force at one end in order to cause a 0.5 mm vertical deflection when the other end of the sheet three inches away is constrained. Thus, in one or more embodiments, a thermally conducting sheet can deflect (to match the topology of an assembled circuit board) by about 0.5 mm for an applied force of up to 3 pounds per linear inch, for a separation of one inch between the perimeters of different components.

The thermally conductive sheet 204 has a first portion 206 that is in thermal contact with the cold plate 202. In FIG. 2 the first portion of the sheet 206 is attached to and makes thermal contact to the underside periphery of the cold plate, at point 304 as shown on FIG. 3. With such a thermal contact between the sheet 206 and cold plate 202 the first portion of the sheet largely matches the topology of the high power component 102 (not visible in FIG. 2). The sheet 204 also has a second portion 208 that matches the topology of the low power component 104 (also not visible in FIG. 2). The second portion of the sheet 208 extends outward from a periphery of the cold plate 202. The second portion 208 is offset from the first portion 206 in a direction perpendicular to the widest surface of the flexible sheet 204. In one or more embodiments, as shown in side view FIG. 3, the second portion 208 of the thermally conductive flexible sheet 204 is typically offset from the first portion 206 by not more than 10 mm and most always by less than the 44.25 mm height of a one rack unit (U) high drawer. In some cases the offset may be essentially zero nominally but have the potential to change over the operation and/or lifetime of the product or result from tolerance variations in component heights. In another embodiment shown in FIG. 4 the first portion of the sheet 206 makes thermal contact with the side of the cold plate 202. This thermal contact at point 304 can be made by attachment of the sheet 404 to the periphery of the cold plate 202 or by a sliding contact such as spring fingers 405. In the case of such a side thermal contact the first portion of the sheet 206 may match the topology of the high power component less directly. In one or more embodiments, thermally conductive sheet 204 may be designed to fit between the cold plate 202 and the high power component 102, thereby making thermal contact with the full bottom of the cold plate. In one or more embodiments, the thermally conductive sheet 204 could be designed to contact the top of the cold plate 202. Note that the cold plate is usually designed with the lowest thermal resistance from the internal fluid to the bottom surface of the cold plate.

In one or more embodiments, the thermally conductive and potentially flexible sheet 204 fits the topology of components on the circuit board 100 within a tolerance of 1.0 mm. In one or more embodiments, the flexible sheet 204 is formed to have an absolute thermal conductivity not less than 40 Watt/meter Kelvin between the first portion 206 and the second portion 208.

In one or more embodiments, the flexible sheet 204 is formed from 1 mm thick folded aluminum sheet metal. In one or more embodiments, the aluminum is alloy 6063.

Figure 3:
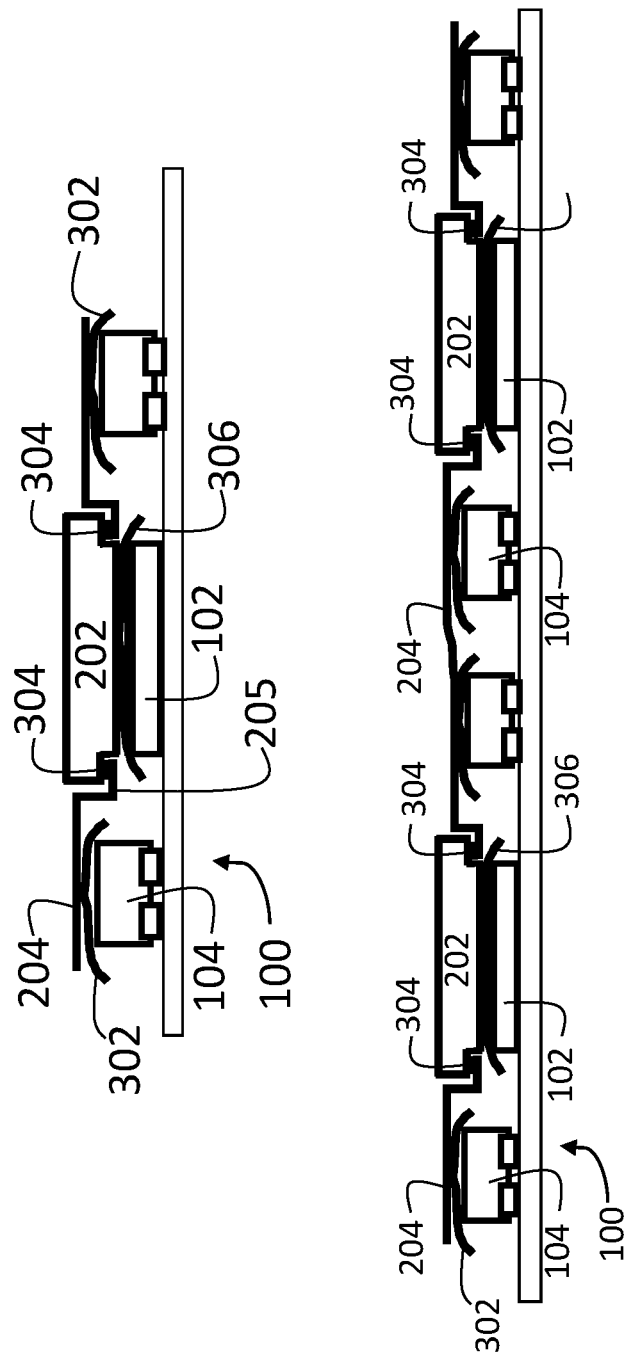
FIG. 3 and FIG. 4 depict in side view the cold plate assembly of FIG. 2, showing two options for making thermal contact between a cold plate covering a high power component and a thermally conductive flexible sheet covering low power components
Figure 4:
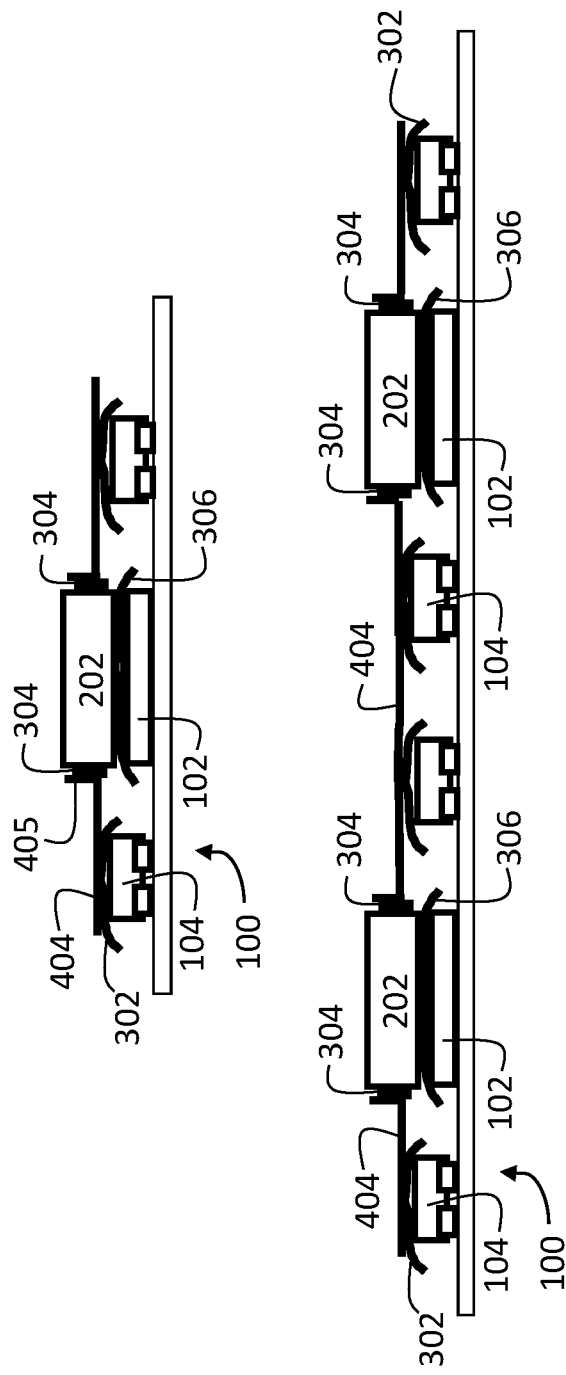

As shown in FIG. 2 the thermally conductive flexible sheet 204 is assembled to the circuit board 100 with the first portion 206 making thermal contact to the cold plate 202. The first portion of the sheet 206 can make thermal contact to the cold plate in a number of ways, one of which is by contacting the underside periphery of cold plate 202 at point 304 as shown in FIG. 3. An alternate way is for the sheet to contact the side periphery of the cold plate 202 at point 304 as shown in FIG. 4. A second portion 208 of the thermally conducting sheet overlays the low power component 104, so that the flexible sheet 204 conducts heat from the low power component 104 to the cold plate 202 while the cold plate also cools the high power component 102 in a manner familiar to the skilled worker. Accordingly, the cold plate 202 is built to remove the heat that is dissipated by the high power component 102 and by the low power component 104. In one or more embodiments, the cold plate 202 makes thermal contact with the high power component 102 through a first separable thermal interface material 306, while the thermally conducting sheet 204 makes thermal contact with the low power component 104 through a second, separable thermal interface material (TIM) 302 in a manner familiar to the skilled worker. For example, the second separable TIM may be foil-coated Sarcon 30x-m, Sarcon 100G-m, or similar material.

Attaching the cold plate(s) 202 to the thermally conductive flexible sheet 204 at location 304, and interfacing the cold plate and sheet assembly to the components 102, 104 via the separable TIMs 306 and 302, provides for reworkability. The cold plate(s) 202 and the flexible sheet 204 can be removed and replaced as a unit in case one of the components 102, 104 needs to be replaced or reattached to the circuit board 100, for example, after a problem in operational testing.

In one or more embodiments, the flexible sheet 204 is mechanically connected to the coolant piping 203 that supplies coolant to the cold plate 202. For example, a tab 210 can attach the flexible sheet 204 to the piping 203. The tab 210 can be attached by welding, by an interference fit, by brazing, or by other means apparent to the ordinary skilled worker.

Given the discussion thus far, it will be appreciated that, in general terms, an exemplary method, according to an aspect of the invention, includes obtaining a topology of a circuit board, which defines locations, dimensions and power dissipation of components on the circuit board. The components include a high power component and a low power component. The method further includes forming a thermally conductive flexible sheet to match the topology. The sheet includes a first portion that makes thermal contact to a cold plate which matches the topology of the high power component. The sheet includes a second portion that matches the topology of the low power component.

In one or more embodiments, forming the thermally conductive sheet includes plastically preforming the sheet to fit the topology of the low power components within a tolerance of 1.0 millimeter (mm). In one or more embodiments, the thermally conductive sheet is flexible, allowing greater mechanical tolerances to be absorbed by the flex of the sheet and less mechanical tolerance to be absorbed by compression of the second TIM between the sheet and the low power component. This allows the second TIM to be designed with a lower nominal thickness, thereby permitting greater thermal conduction through the second TIM. In such cases the flexible sheet of length three inches and width one inch requires a force of up to 0.12 pounds (lbs) applied to its end to cause a deflection by about 0.5 mm, when the far end of the section of sheet three inches away is constrained. In one or more embodiments, forming the thermally conductive flexible sheet includes forming the sheet to have a thermal conductivity not less than 40 Watt per meter Kelvin between the first portion and the second portion.

In one or more embodiments, the method further includes assembling the thermally conductive flexible sheet to the circuit board with the first portion of the sheet making thermal contact to the cold plate which itself makes contact through a first TIM to the high power component and with the second portion of the sheet overlaying the low power component or components. The sheet contacts the low power components of the circuit board via a second separable thermal interface material (TIM), and the sheet conducts heat from the low power components to the cold plate.

In one or more embodiments, the method further includes removing the thermally conductive sheet and the cold plate from the circuit board as a unit.

In one or more embodiments, the method further includes attaching a plurality of cold plates to a plurality of first portions of the sheet, the bottom surface of each of the cold plates matching the topology of a corresponding high power component on the circuit board. In an alternate embodiment the plurality of cold plates make thermal contact with but are not attached to the first portions of the sheet.

An exemplary apparatus includes a cold plate and a thermally conductive flexible sheet that has a first portion attached to a base, side or edge of the cold plate and that extends outward from a periphery of the cold plate to a second portion. In one or more embodiments, the second portion of the thermally conductive flexible sheet is offset from the first portion of the sheet in a direction transverse the surface of the sheet by not more than one rack unit or 44.25 mm. In one or more embodiments, the thermally conductive flexible sheet is formed of aluminum alloy 6063. In one or more embodiments, the thermally conductive sheet has a thermal conductivity not less than 40 Watt/meter Kelvin between the first portion and the second portion.

Another exemplary apparatus includes a circuit board, which has a topology that defines locations, dimensions and power dissipation of components mounted to the circuit board; a high power component mounted to the circuit board; a low power component mounted to the circuit board; and a thermally conductive flexible sheet that is formed to contact a cold plate, to match the topology of the low power components, and to overlay the circuit board. The sheet includes a first portion that makes thermal contact with the cold plate that overlays the high power component. The sheet includes a second portion that overlays the low power component.

In one or more embodiments, forming the thermally conductive flexible sheet includes plastically forming the sheet to fit the topology within a tolerance of 1.0 mm. In one or more embodiments, the high power component protrudes from the circuit board to a first height and the low power component protrudes from the circuit board to a second height that is different from the first height. In one or more embodiments, the thermally conductive flexible sheet is formed of aluminum alloy 6063. In one or more embodiments, forming the thermally conductive flexible sheet includes forming the sheet to have a thermal conductivity not less than 40 Watts per meter Kelvin between the first portion and the second portion. In one or more embodiments, the high power component dissipates greater than 25 Watts heat. In one or more embodiments, the low power component dissipates less than 5 Watts heat. In one or more embodiments, the apparatus also includes separable thermal interface materials disposed both between the cold plate and the high power components as well as between the sheet and the low power components mounted to the circuit board. In one or more embodiments, the apparatus also includes coolant piping connected in fluid communication with the cold plate, and the thermally conductive flexible sheet is attached to the coolant piping by a tab.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   obtaining a topology of an assembled circuit board, wherein the topology defines dimensions and locations of components on the circuit board, wherein the components include a high power component and one or more low power components;
   attaching a cold plate in thermal contact with the high power component via a thermal interface material (TIM), wherein the cold plate and the TIM match the topology of the high power component in a first region; and
   forming a thermally conductive sheet, wherein the sheet comprises a first portion that is thermally connected to the cold plate in the region of the high power component and a second portion that matches the topology of the one or more low power components, wherein the first portion of the thermally conductive sheet is attached to the cold plate by spring fingers around a periphery of the cold plate.

2. The method of claim 1 wherein forming the thermally conductive sheet includes plastically preforming the sheet to fit the topology within a tolerance of 1.0 millimeter (mm).

3. The method of claim 1 wherein the thermally conductive sheet is flexible, so that it can deflect to match the topology by about 0.5 mm for an applied force of up to 3 pounds per linear inch, for a separation of one inch between the perimeters of different components.

4. The method of claim 1 wherein forming the thermally conductive sheet includes forming the sheet to have a thermal conductivity not less than 40 Watts per meter Kelvin between the first portion and the second portion.

5. The method of claim 1 further comprising: assembling the thermally conductive sheet to the circuit board with the first portion of the sheet making thermal contact with the cold plate that overlays the high power component and with the second portion of the sheet overlaying the one or more low power components, wherein the sheet contacts the low power component or components of the circuit board via a separable thermal interface material, and the sheet conducts heat from the low power component or components to the cold plate.

6. The method of claim 5 further comprising: removing the thermally conductive sheet and the cold plate from the circuit board as a unit.

7. The method of claim 1 further comprising: making thermal contact between a plurality of cold plates and a plurality of first portions of the thermally conductive sheet, wherein the overall structure comprising cold plates and sheet allows for vertical displacement between the designed positions of the various cold plates, in order to adjust to tolerances in the assembled heights of the cold plates above the circuit board, wherein the assembly can absorb about 0.5 mm of height variation between a pair of cold plates for an applied force of up to 3 pounds per linear inch, given a separation of one inch between the perimeters of the different cold plates.

8. The method of claim 7, wherein the vertical displacement between cold plates is enabled by flexing of the thermally conductive sheet.

9. The method of claim 7, wherein the vertical displacement between cold plates is enabled by flexing or slippage of the thermal contact between the first portions of the sheet and the cold plates.

10. An apparatus comprising:
an assembled circuit board, which has a topology that defines positions and dimensions of components mounted to the circuit board;
a high-power component mounted to the circuit board;
a cold plate that makes thermal contact with the high power component through a first thermal interface material (TIM);
one or more low-power components mounted to the circuit board;
a thermally conductive sheet that is formed to match the topology and that overlays the circuit board, wherein the sheet comprises a first portion that makes thermal contact with the cold plate and a second portion that overlays the low power component or components, wherein the first portion is movably attached to the cold plate via spring fingers that surround a periphery of the cold plate.

11. The apparatus of claim 10 wherein forming the thermally conductive sheet includes plastically preforming the sheet to fit the topology within a tolerance of 1.0 mm.

12. The apparatus of claim 11 wherein the high power component protrudes from the circuit board to a first height and the low power component protrudes from the circuit board to a second height that is different from the first height.

13. The apparatus of claim 10 wherein forming the thermally conductive sheet includes forming the sheet to have a thermal conductivity not less than 40 Watts per meter Kelvin between the first portion and the second portion.

14. The apparatus of claim 10 further comprising a separable thermal interface material disposed between the sheet and the low power components mounted to the circuit board.

15. The apparatus of claim 10 further comprising coolant piping connected in fluid communication with the cold plate, wherein the thermally conductive sheet is attached to the coolant piping by a tab.

\* \* \* \* \*